United States Patent
Wang et al.

(10) Patent No.: US 12,189,299 B2
(45) Date of Patent: Jan. 7, 2025

(54) DIGITAL LITHOGRAPHY SCAN SEQUENCING

(71) Applicant: Applied Materials, Inc., Santa Clara, CA (US)

(72) Inventors: Ying-Chiao Wang, Tainan (TW); Thomas L Laidig, Richmond, CA (US); Chun-Chih Chuang, Changhua (TW); Frederick Lie, Changhua County (TW); Chen-Yuan Hsieh, Changhua County (TW); Chun-Cheng Yeh, Changhua (TW)

(73) Assignee: Applied Materials, Inc., Santa Clara, CA (US)

( * ) Notice: Subject to any disclaimer, the term of this patent is extended or adjusted under 35 U.S.C. 154(b) by 134 days.

(21) Appl. No.: 18/115,145

(22) Filed: Feb. 28, 2023

(65) Prior Publication Data

US 2024/0288778 A1    Aug. 29, 2024

(51) Int. Cl.
*G03F 7/00*    (2006.01)

(52) U.S. Cl.
CPC .......... *G03F 7/704* (2013.01); *G03F 7/70458* (2013.01); *G03F 7/70475* (2013.01); *G03F 7/70525* (2013.01)

(58) Field of Classification Search
CPC .. G03F 7/704; G03F 7/70458; G03F 7/70475; G03F 7/70525
USPC ...................................................... 430/296
See application file for complete search history.

(56) References Cited

U.S. PATENT DOCUMENTS

2013/0215407 A1    8/2013    Horiuchi et al.

FOREIGN PATENT DOCUMENTS

| CN | 102707576 A | 10/2012 |
| KR | 20130073442 A | 7/2013 |
| KR | 20220128036 A | 9/2022 |
| WO | 2022265621 A1 | 12/2022 |

OTHER PUBLICATIONS

International Search Report and Written Opinion for International Application No. PCT/US2024/017322, mailed Jun. 17, 2024, 8 Pages.

*Primary Examiner* — Christopher G Young
(74) *Attorney, Agent, or Firm* — LOWENSTEIN SANDLER LLP

(57) ABSTRACT

A digital lithography system includes adjacent scan regions, exposure units located above the scan regions, a memory, and a processing device operatively coupled to the memory. The exposure units include a first exposure unit associated with a first scan region and a second exposure unit associated with a second scan region. The processing device is to initiate a digital lithography process to pattern a substrate disposed on a stage in accordance with instructions. The processing device is to further perform a first pass of the first exposure unit over a stitching region at an interface of the first scan region and the second scan region at a first time. The processing device is to further perform a second pass of the second exposure unit over the stitching region at a second time that varies from the first time by less than forty seconds.

20 Claims, 12 Drawing Sheets

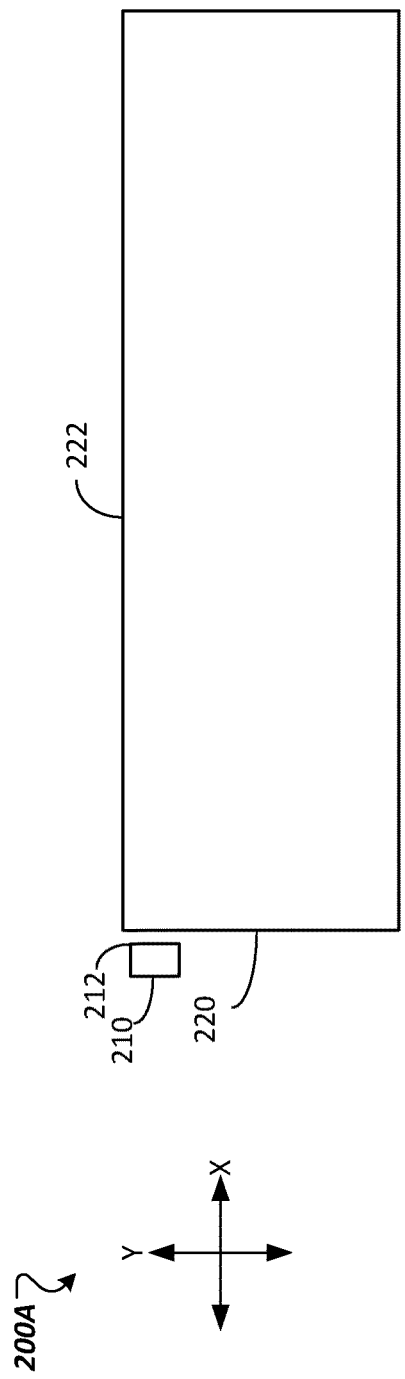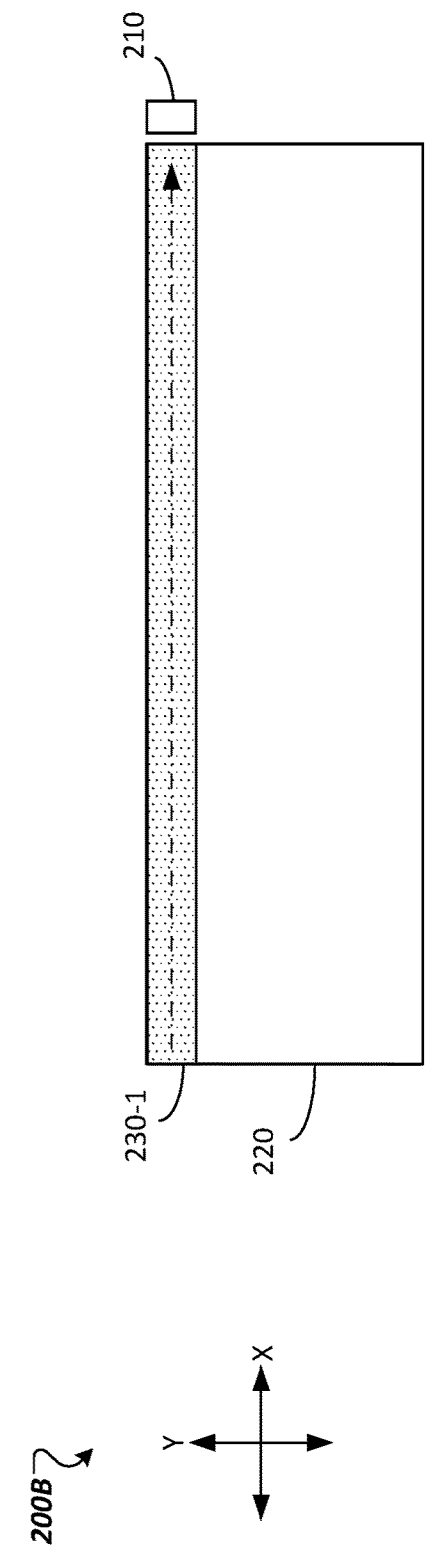

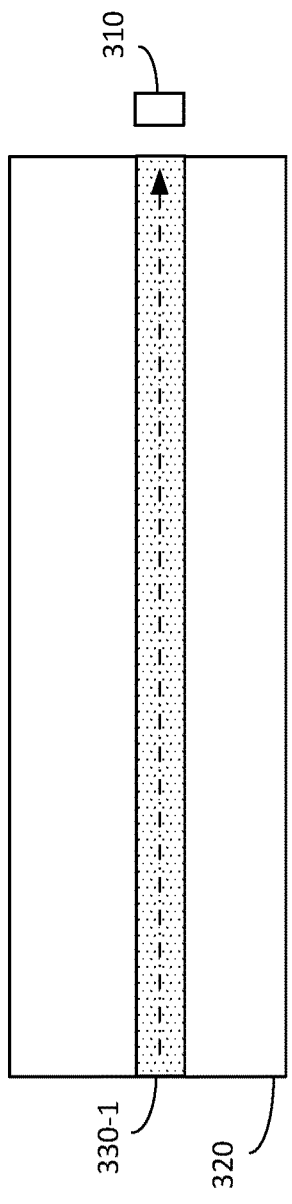
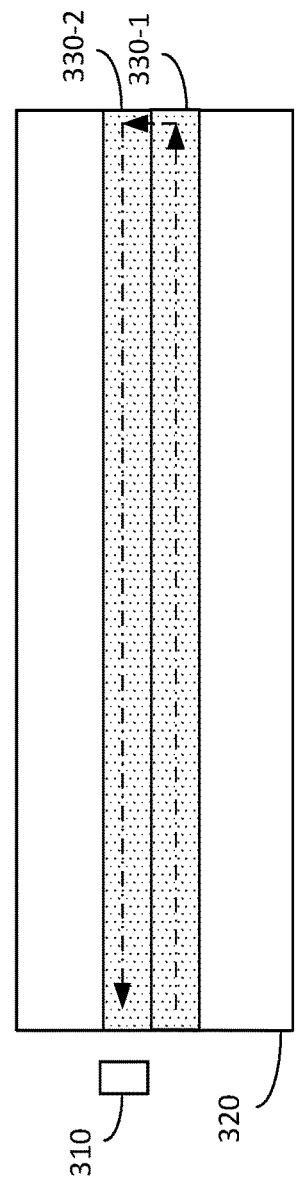
FIG. 3A
FIG. 3B

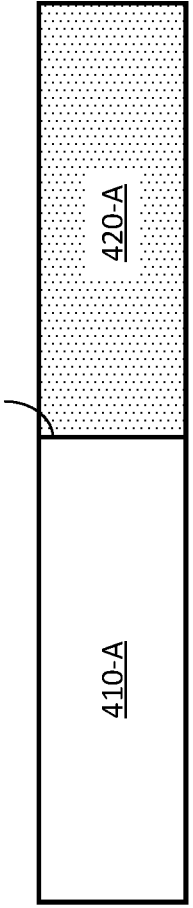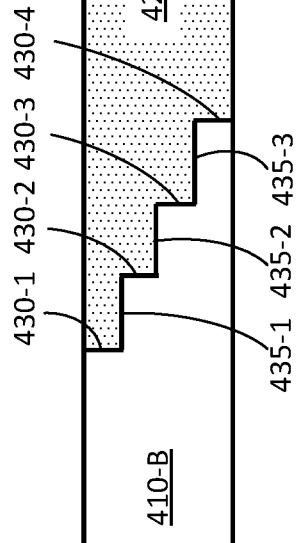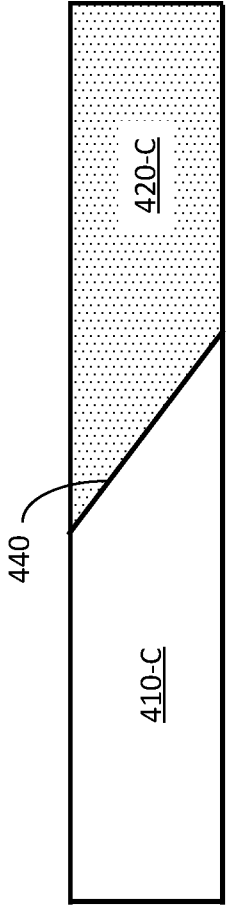

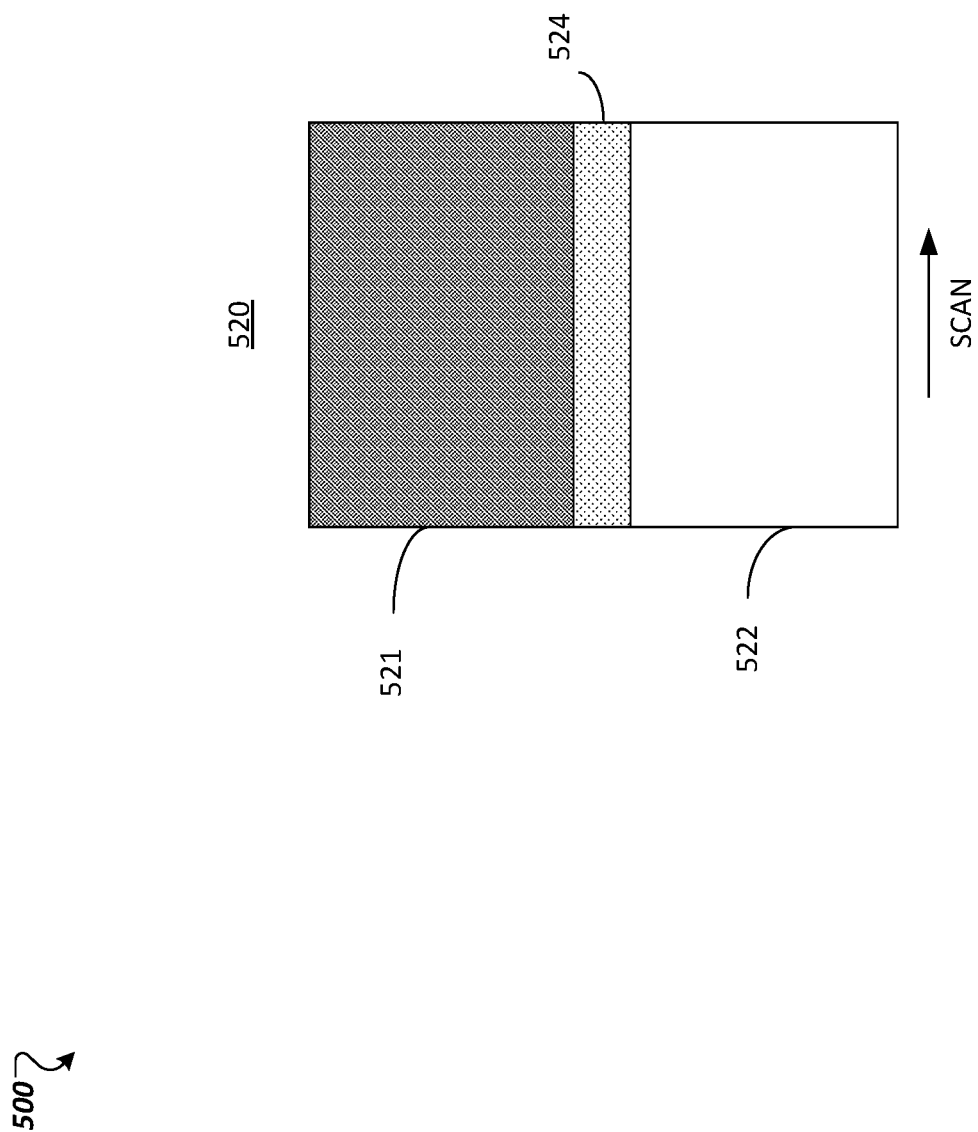

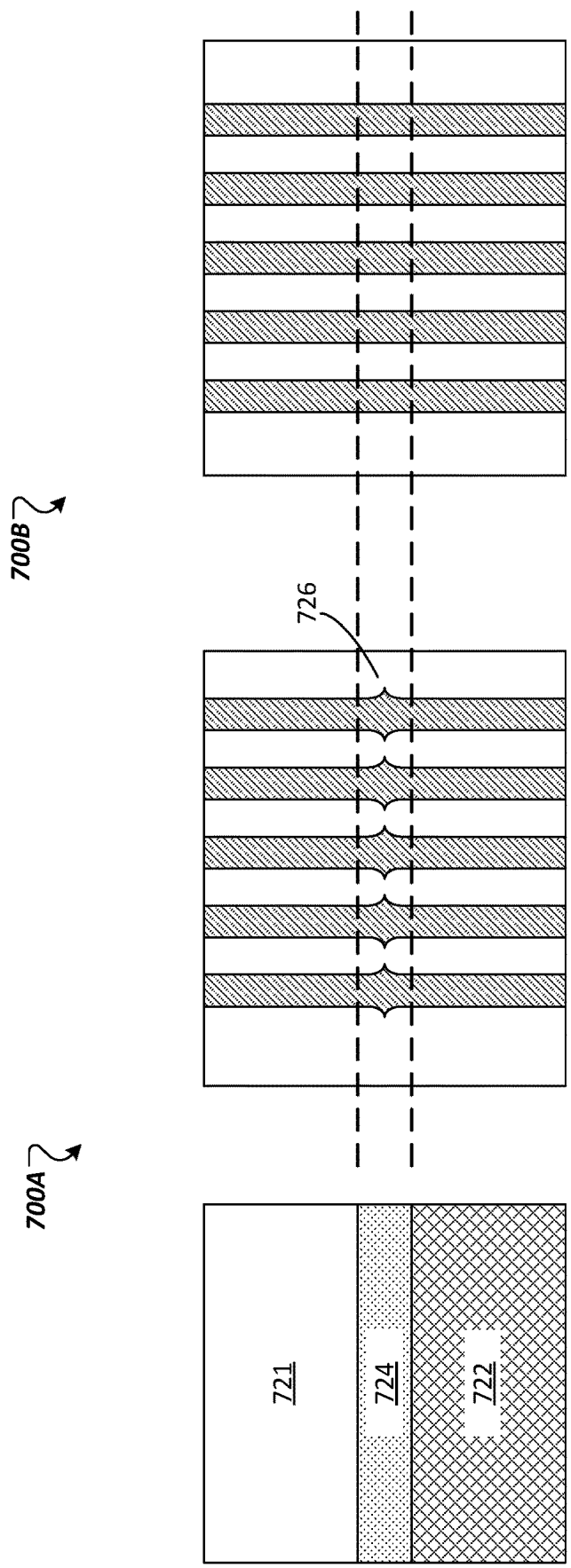

800

```
Receive instructions to perform a digital
photolithography process to pattern a substrate
                      810
                       │
                       ▼
Initiate the digital lithography process to pattern the
    substrate in accordance with the instructions
                      820
                       │
                       ▼
Perform, at a first time, a first pass of a first exposure unit
over a stitching region at an interface of a first scan region
                 and a second scan region
                           830

Perform, at a second time varying from the first time by
    less than forty seconds, a second pass of a second
            exposure unit over the stitching region
                           840
```

FIG. 8

DIGITAL LITHOGRAPHY SCAN SEQUENCING

TECHNICAL FIELD

The instant specification generally relates to electronic device fabrication. More specifically, the instant specification relates to digital lithography.

BACKGROUND

Photolithography is used in the manufacturing of semiconductor devices and display devices, such as flat panel display devices. Examples of flat panel display devices include thin-film display devices, such as, e.g., liquid crystal display (LCD) devices and organic light emitting diode (OLED) display devices. Large-area substrates can be used to manufacture flat panel display devices for use with computers, touch panel devices, personal digital assistants (PDAs), cell phones, television monitors, etc.

In digital lithography, multiple exposure units are used to increase throughput, where each exposure unit is responsible for a portion of a printing area. However, delays in scanning at boundaries can cause abnormalities in the formed features. This can result in visible boundaries between regions printed by the different exposure units. For display devices, the visible boundaries are defects that can cause manufactured displays to be scrapped.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In accordance with at least one embodiment, a digital lithography system is provided. The digital lithography system includes multiple scan regions, including a first scan region and a second scan region adjacent to the first scan region. The digital lithography system further includes multiple exposure units located above the multiple scan regions. The multiple exposure units include a first exposure unit associated with the first scan region and a second exposure unit associated with the second scan region. The digital lithography system further includes a memory and at least one processing device operatively coupled to the memory. The at least one processing device is to initiate a digital lithography process to pattern a substrate disposed on a stage in accordance with instructions. The at least one processing device is further to perform a first pass of the first exposure unit over a stitching region at an interface of the first scan region and the second scan region at a first time. The at least one processing device is further to perform a second pass of the second exposure unit over the stitching region at a second time that varies from the first time by less than forty seconds.

In accordance with at least one embodiment, a system is provided. The system includes a memory and at least one processing device operatively coupled to the memory. The at least one processing device is to initiate a digital lithography process to pattern a substrate in accordance with instructions. The at least one processing device is further to perform a first pass of a first exposure unit over a stitching region at an interface of a first scan region of a plurality of scan regions and a second scan region of the plurality of scan regions at a first time. The at least one processing device is further to perform a second pass of a second exposure unit over the stitching region at a second time that varies from the first time by less than forty seconds.

In accordance with at least one embodiment, a method is provided. The method includes initiated, by a processing device, a digital lithography process to pattern a substrate in accordance with instructions. The method further includes performing a first pass of a first exposure unit over a stitching region at an interface of a first scan region of a plurality of scan regions and a second scan region of the plurality of scan regions at a first time. The method further includes performing a second pass of a second exposure unit over the stitching region at a second time that varies from the first time by less than forty seconds.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

FIGS. 2A-2D are top-down views showing a scan path of a substrate through a single digital lithography exposure unit of a digital lithography system, in accordance with some embodiments.

FIGS. 3A-3D are top-down views showing a scan path of a substrate through a single digital lithography exposure unit of a digital lithography system, in accordance with some embodiments.

FIGS. 4A-4C are diagrams showing examples of digital lithography exposure unit boundary smoothing, in accordance with some embodiments.

FIG. 5 is a diagram of example scan configuration of digital lithography exposure units in a one-bridge implementation, in accordance with some embodiments.

FIG. 7 is a diagram showing features formed on a substrate by digital lithography processes, in accordance with some embodiments.

FIG. 8 is a flow chart of a method for implementing digital lithography scan sequencing, in accordance with some embodiments.

DETAILED DESCRIPTION

Figure 1:
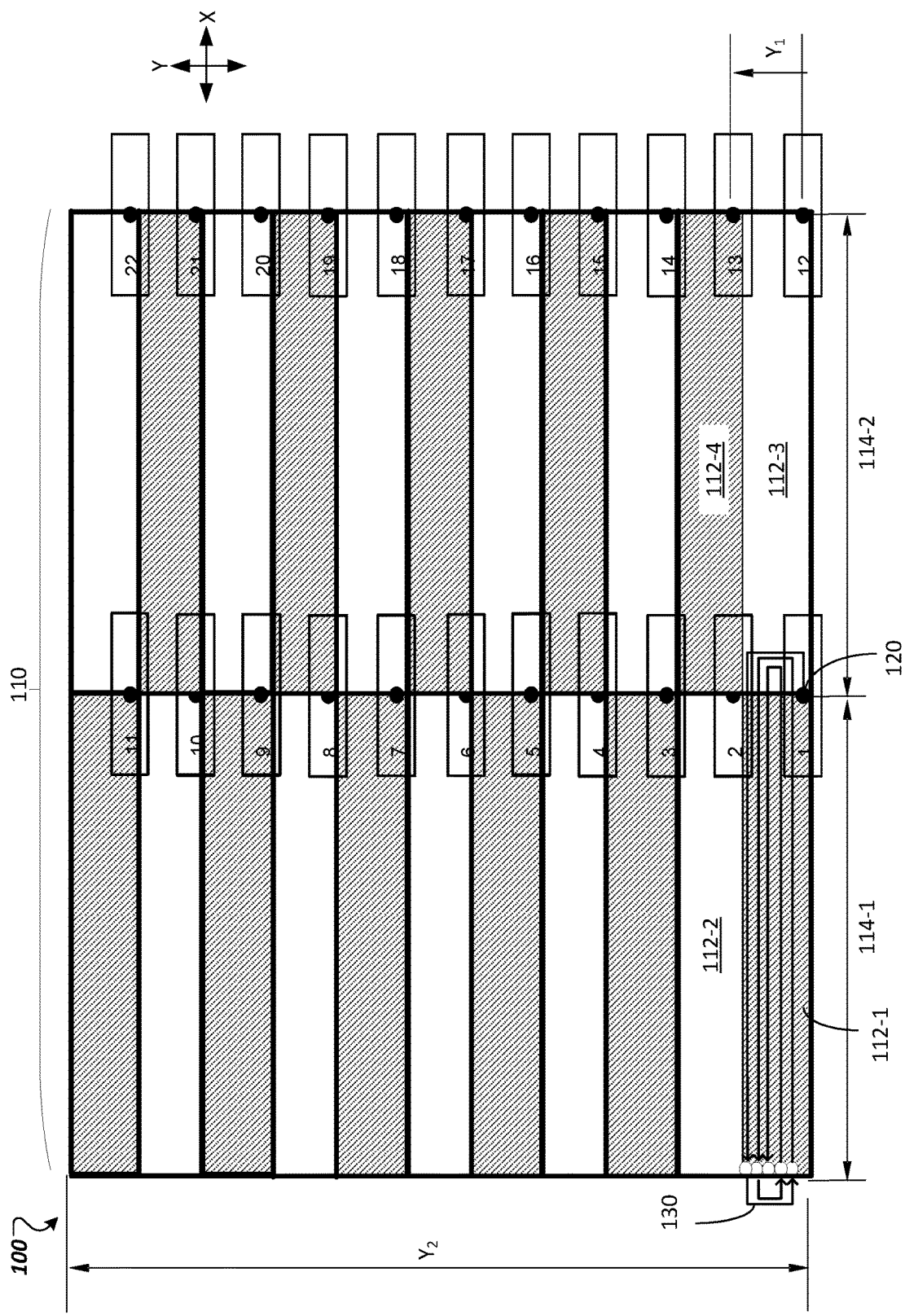
FIG. 1 is a top-down view of a digital lithography system, in accordance with some embodiments

Digital lithography can be used to generate a pattern (e.g., for a digitally aligned etch mask) onto a substrate surface without the use of a photomask (e.g., via maskless lithography). Digital lithography technology (e.g., such as Texas Instruments'® programmable light steering technology) enables high speed and high-resolution maskless lithography solutions for printed circuit board (PCB) patterning, solder masks, flat panel displays, laser marking, and other digital exposure systems that benefit from high speed and precision. Digital lithography is used to directly expose patterns onto photoresist films without the use of contact masks (e.g., photomasks). This can reduce material cost, improves production rates, and allow for rapid changes of the pattern. Direct exposure increases productivity compared to narrow laser beam or masked systems. An advantage of digital lithography is the ability to change lithography patterns from one run to the next, without incurring the cost of generating a new photomask. Illustratively, digital lithography can be used to perform large-area patterning during electronic device fabrication.

In digital lithography, multiple digital lithography exposure units ("exposure units") can be used to improve throughput of a digital lithography tool. Conventional exposure units can print or expose a rectangular non-overlapping region, or clipping layer. The clipping layer may serve as a filter to inform layout-processing software to keep patterns to be printed by a particular exposure unit on the clipping layer associated with that exposure unit. Each of the multiple exposure units can be responsible for a portion of the printing area and for a different clipping layer. Scans at exposure unit boundaries can be delayed from one scan to another. This delay can result in non-uniformity (e.g., unevenness, inconsistency, irregularity) at exposure unit boundaries (e.g., "stitching regions"). This non-uniformity can reduce yield and thus decrease value.

Exposure units often sequentially scan sub-portions of a portion of the printing area to increase throughput. For example, an exposure unit may scan a first portion of the printing area, followed by an adjacent second portion, an adjacent third portion, etc. Because adjacent exposure units move together across the printing area, sequentially scanning sub-portions of the printing area leads to delays in scanning by adjacent exposure units at the exposure unit boundaries (e.g., at the stitching regions). The delay in scanning can cause abnormalities in features formed by the scanning. These abnormalities can cause variances in critical dimensions which in turn necessitate scrapping product, reducing overall yield.

Aspects and implementations of the present disclosure address these and other shortcomings of existing technologies by performing the scanning using a digital lithography scan sequencing to reduce delay between scans of stitching regions at the interface between exposure unit boundaries. Reducing delay between stitching region scans can reduce abnormalities in features printed in the stitching regions and can result in a gradual transition between the pair of exposure units. At least two different scanning sequences can be utilized to perform digital lithography scanning in accordance with the implementations described herein. In some embodiments, an inner-to-outer scanning sequence can be implemented so that scans of a stitching region at the boundary of two adjacent scanning regions by two adjacent exposure units happen sequentially, one scan followed by the next. In some embodiments, an outer-to-inner scanning sequence can be implemented similarly. Scanning the stitching region first with the first exposure unit and subsequently with the second exposure unit reduces delay between the scans, leading to more uniform features formed on the substrate, especially at the stitching region. In some embodiments, the delay between scanning the stitching region using the first exposure unit and scanning the stitching region using the second exposure unit is less than forty seconds.

In some embodiments, a first sub-region of a scanning region of a first exposure unit (e.g., within the exposure unit boundary) proximate an edge of the scanning region is scanned, followed by the scanning of a second sub-region proximate the opposite edge of the scanning region. The first sub-region and the second sub-region may be stitching regions associated with the scanning region and adjacent scanning region(s). A third sub-region is scanned proximate the first sub-region, followed by the scanning of a fourth sub-region proximate the second sub-region, etc., until all sub-regions of the scanning region are scanned. The above-described sequence may be referred to as an outer-to-inner scanning sequence. Further details regarding the outer-to-inner scanning sequence are described herein below with respect to FIGS. 2A-2D.

In some embodiments, a first sub-region of a scanning region proximate a centerline of a scanning region (e.g., an inner sub-region, a center sub-region, etc.) is scanned, followed by the scanning of a second sub-region proximate the first sub-region. A third sub-region is then scanned proximate the first sub-region on the opposite side of the first sub-region from the second sub-region. The scanning continues until both edge sub-regions of the scanning region are scanned. The edge sub-regions may be stitching regions associated with the scanning region and adjacent scanning region(s). The above-described sequence may be referred to as an inner-to-outer scanning sequence. Further details regarding the inner-to-outer scanning sequence are described herein below with respect to FIGS. 3A-3D.

Aspects and implementations of the present disclosure result in technological advantages over other approaches. For example, as mentioned above, non-uniformity at the boundary (e.g., at the stitching region) of a pair of adjacent exposure units and/or non-uniformity at the boundary of a pair of scans associated with a given exposure unit can be reduced. Accordingly, improved photolithography for patterning substrates can be achieved.

FIG. 1 is a top-down view of a digital lithography system ("system") 100, in accordance with some embodiments. As shown, the digital lithography system 100 includes a stage assembly 110 including a base (e.g., a granite base), a stage and a substrate disposed on the stage. The substrate may be a glass plate, a wafer, a PCB, or other type of substrate. The substrate may correspond to or be positioned in a digital lithography printing or scanning area having a number of scan regions, including scan regions 112-1 through 112-4. The left portion of the stage assembly 110 corresponds to a first bridge 114-1 above the stage assembly 110 and the right portion of the stage assembly 110 corresponds to a second bridge 114-2 above the stage assembly 110. Exposure units are attached to the bridges 114-1 and 114-2. In some embodiments, the length of each bridge 114-1 and 114-2 can range between about 500) (millimeters) mm and about 1000 mm. For example, the length of each bridge 114-1 and 114-2 can be about 750) mm.

The substrate can include a photoresist material disposed on a material to be etched. The photoresist material can be a positive photoresist material (i.e., where a portion of the photoresist material that is exposed to light becomes soluble to a photoresist developer) or a negative photoresist material (i.e., where a portion of the photoresist material that is exposed to light becomes insoluble to a photoresist developer). Thus, by removing designated portions of the photoresist material, a photoresist pattern can be formed. In some embodiments, the material to be etched is a conductive material (e.g., metal). For example, the conductive material can be molybdenum. After the designated regions of the photoresist material are removed, the now-exposed material can be etched in accordance with the photoresist pattern. For example, wiring can be formed during the etch process. Alternatively, the patterned material can itself be photosensitive, eliminating the need to add a photoresist layer and performing the following etch process.

To perform the photoresist patterning, the digital lithography system 100 further includes a first column of digital lithography exposure units ("exposure units") hanging from the first bridge 114-1 and a second column of exposure units hanging from the second bridge 114-2. For example, the first column of exposure units includes exposure units 1 through 11 and the second column of exposure units includes exposure units 12 through 22. Thus, in this illustrative example, there are 22 total exposure units shown. However, the number of exposure units shown in FIG. 1 should not be considered limiting, and the digital lithography system 100 can include any suitable number of exposure units accordance with the embodiments described herein.

Each exposure unit can include a lens assembly that can project an image onto the photoresist material of the substrate. Each lens assembly is shown adjacent to a bottom-right corner of its associated scan region. For example, a lens assembly 120 of exposure unit 1 is associated with the scan region 112-1. In some embodiments, each lens assembly is about 4 mm tall and about 3 mm wide. However, each lens assembly can have any suitable dimensions in accordance with the embodiments described herein.

During a digital lithography process, each exposure unit is moved relative to the substrate to expose a region (e.g., a rectangular region) of the substrate to electromagnetic radiation such as light (e.g., ultraviolet light, near-ultraviolet light, etc.). During scanning, the exposure units expose respective scan regions, in accordance with a programmed scan path. Instead of having the exposure units move above the stage assembly 110, the stage assembly 110 can move in the X-Y direction underneath the exposure units in accordance with the programmed scan path. Since the field-of-view of a lens assembly (e.g., lens assembly 120) can be smaller than its associated scan region (e.g., scan region 112-1), the stage assembly 110 may have to move back and forth repeatedly until the entire scan region (e.g., scan region 112-1) is printed. The lens assembly 120 is projected to scan the scan region 112-1, except for the first and last scans where trimming may occur based on the definition of the scan region 112-1. The greater the number of exposure units, the fewer scans that may be performed, which can correspond to higher throughput.

Each exposure unit can be responsible for a different scan region, which may or may not overlap with the adjacent scan regions of other exposure units. To avoid abrupt transitions from a first scan region to a second scan region adjacent to the first scan region (either attached to the same bridge or to a different bridge), the exposure unit corresponding to the first scan region can encroach into the second scan region. Similarly, the exposure unit corresponding to the second scan region can encroach into the first scan region. For example, exposure unit 1 can encroach into scan region 112-2 and/or scan region 112-3, and exposure unit 2 can encroach into scan region 112-1 and/or scan region 112-4. Accordingly, shared exposures can be observed at boundaries or "stitching lines" between adjacent exposure units of the same bridge and/or exposure units on different bridges.

A stitching line can be defined by a clipping layer, which can be a software-defined layer that sets the scan path boundary for each exposure unit during movement of the stage assembly 110. A stitching line may be visible on the substrate after printing due to non-ideal printing conditions. For example, if the actual location of an exposure unit is shifted by about 1 micron, there may be a 1 micron-wide gap or double exposed band near the stitching line. Although the stitching lines in this illustrative example are shown as straight lines (such that the scan regions are rectangular shaped), the stitching lines can be curvy (e.g., wavy).

A path 130 of the exposure unit 120-1 is illustratively depicted. The path 130 may proceed in a back-and-forth fashion. More specifically, during scanning, the stage assembly 110 moves in the X direction (i.e., from right to left) across the scan region 120-1, during which time the exposure unit 120-1 patterns a line across the scan region 120-1. The stage assembly 110, upon reaching the left edge of the scan region 112-1, moves in the Y-direction (i.e., up or down), and then back moves in the X-direction (i.e., from left to right) to pattern another line across the scan region 120-1. The stage assembly 110 then moves again in the Y-direction (i.e., up or down), and then again in the X-direction (i.e., from right to left). The path 130 may proceed in this back-and-forth fashion until the entirety of the scan region 120-1 has been scanned, at which point a full image has been patterned on the substrate. The image can then be developed for substrate etching. The distance of stage travel in the Y-direction during scanning. "$Y_1$", can be any suitable distance in accordance with the embodiments described herein. In some embodiments, $Y_1$ can range between about 150 mm and about 180 mm. For example. $Y_1$ can be about 164 mm. The scan distance in the X direction for each exposure unit corresponds to the length of the bridges 114-1 and 114-2 in embodiments. The total width of the scan regions, "$Y_2$", can be any suitable width in accordance with the embodiments described herein. In some embodiments, "$Y_2$" can range between about 1600 mm and about 2000 mm. For example, $Y_2$ can be about 1800 mm. The travel distance for each scan (e.g., in the X-direction) can be different due to differences in substrate size. For example, in some embodiments, the substrate includes an 8-inch round wafer. As another example, in some embodiments, the substrate includes a 12-inch round wafer.

The scanning process shown in FIG. 1 can be used to create a display (e.g., a flat panel display) in some embodiments. In some embodiments, the display is a liquid-crystal display (LCD). Further details regarding the scan path 130 the exposure unit 120-1 will now be described below with reference to FIGS. 2A-2D.

FIGS. 2A-2D are top-down views 200A-200D of an outer-to-inner scan path of a scan region 220 of a substrate through a single digital lithography exposure unit ("exposure unit") 210 of a digital lithography system, in accordance with some embodiments. The exposure unit 210 can be, for example, the exposure unit 120-1 of the digital lithography system 100 described above with reference to FIG. 1. The substrate is disposed on a stage (not shown). In some embodiments, the first designated area to be scanned (e.g., sub-region of scan region 220) may be proximate an edge of scan region 220.

FIG. 2A shows the exposure unit 210 and a scan region 220 of a substrate prior to a first scan being performed using the exposure unit 210. An edge 222 of the scan region 220 can be aligned with an edge 212 of the exposure unit 210 prior to a first scan performed. The stage moves the substrate in the X-Y direction(s) in accordance with a digital lithography scanning procedure performing a number of scans across the scan region 220.

FIG. 2B shows the formation of a scanned area 230-1 within the scan region 220 after the first scan is performed using the exposure unit 210. More specifically, the stage moves the substrate in the positive X direction underneath the exposure unit 210 to form the scanned area 230-1. In some embodiments, scanned area 230-1 and/or scanned area 230-2 correspond to stitching regions that are associated with the scan region 220 and an adjacent scan region. A scanned area such as scanned area 230-1 may be referred to as a sub-region of scan region 220. The amount of time that the exposure unit 210 uses to scan scanned area 230-1 may be referred to as a scan duration.

Figure 2C:
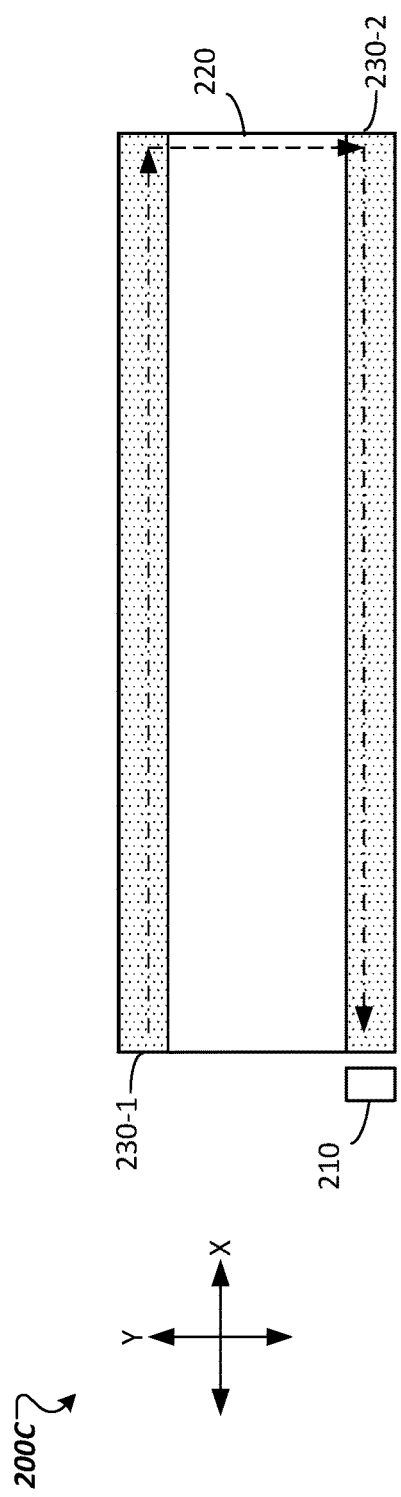

FIG. 2C shows the formation of a scanned area 230-2 after a second scan is performed using the exposure unit 210. More specifically, after the first scan is performed using the exposure unit 210, the stage moves the substrate in the negative Y direction to align the exposure unit 210 with the next designated region, and then the stage moves the substrate in the negative X direction underneath the exposure unit 210 to form the scanned area 230-2.

Figure 2D:
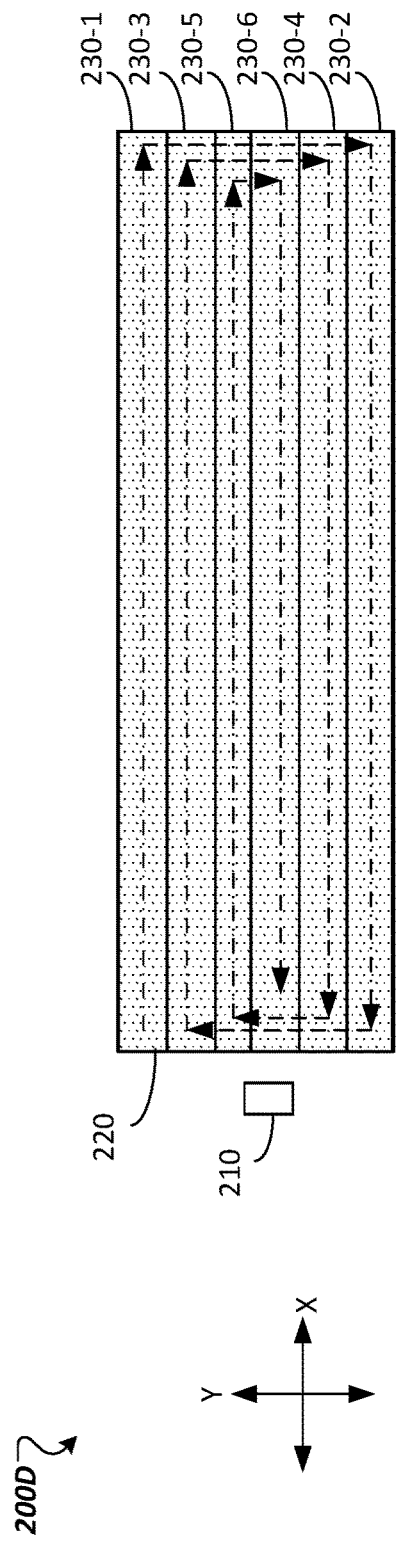

FIG. 2D shows the formation of a scanned area 230-3 after a third scan is performed using the exposure unit 210. More specifically, after the second scan is performed using the exposure unit 210, the stage moves the substrate in the positive Y direction to align the exposure unit 210 with the next designated region, and then the stage moves the substrate in the positive X direction underneath the exposure unit 210 to form the scanned area 230-3. Additional scans such as a fourth, a fifth, and a sixth scan can be performed to finish the scanning by forming scanned areas 230-4, 230-5, and 230-6.

During the scanning process described above, one or more "mura" problems can be observed. Mura is a Japanese term that generally refers to any visible variation that occurs across the display that occurs due to the scanning process.

One example of mura is "scan mura" that occurs after every scan. For example, one type of scan mura is illumination non-uniformity, in which the exposure field of an exposure unit is inconsistent (e.g., a top edge of the exposure field has a different illumination field than a bottom edge). More specifically, every time a scan is performed to scan a line or "paint a stripe," the top edge of the scan will be brighter or dimmer than the bottom edge. This can adversely affect the patterning dimensions. Another example of mura is "vibrational mura," where vibrations resulting from operation of the digital lithography system can cause exposure units to vibrate, resulting in scan choppiness. Since the exposure unit vibrations may not be spatially synchronized, this can result in visible variations across the display.

Another example of mura is "boundary mura," in which an abrupt change in appearance can be observed at the boundary or edge of a region scanned by one exposure unit and an adjacent region scanned by another exposure unit. For example, boundary mura can occur at the boundary between regions scanned by a pair of adjacent exposure units of a given bridge (e.g., the boundary between scan regions 112-2 and 112-4 of FIG. 1). As another example, boundary mura can occur at the boundary between regions scanned by a pair of adjacent exposure units corresponding to different bridges (e.g., the boundary between scan regions 112-1 and 112-2 of FIG. 1).

There can be a variety of different microscopic and/or macroscopic causes of boundary mura. For example, if one exposure unit is outputting more light than an adjacent exposure unit during scanning, then a sudden change in the line widths of the printed lines can be observed across the boundary between the exposure units. As another example, if one exposure unit is out of focus compared to the other exposure unit, then a photoresist sidewall profile corresponding to each exposure unit can be different. For example, the exposure unit with better focus can have a more vertical sidewall, as compared to a more sloped sidewall of the exposure unit with poorer focus. Accordingly, problems can exist at the boundaries of adjacent scan regions.

As will be described in further detail herein, mura (e.g., boundary mura) can be addressed by performing the scanning sequencing described herein, such as the outer-to-inner sequence described with respect to FIGS. 2A-2D above or the inner-to-outer sequence described with respect to FIGS. 3A-3D below to decrease the delay between scans of the stitching regions at the edges of the scan regions. For example, the digital lithography sequencing described herein can be performed to create a smooth transition between regions scanned by different exposure units (e.g., maintain a critical dimension across regions).

In some embodiments, performing the sequencing described herein includes performing dose mixing, where a dose refers to an amount of radiation or light that a region is exposed to. For dose mixing, the intensity of the light source may be adjusted during scanning of one or more portions of a region associated with an exposure unit. Alternatively, or additionally, a number of passes applied to different portions of the region associated with the exposure unit may be varied to provide different exposure levels by the exposure unit. For example, a first exposure unit may apply 100% of a target light intensity to achieve a full dose to a majority of a region for which the first exposure unit is responsible. However, for a portion of the region that the first exposure unit is responsible (such as a stitching region), the first exposure unit may apply 50% of the target light intensity to provide a half dose. A second exposure unit may cross over into the region for which the first exposure unit is responsible (e.g., the stitching region), and may apply 50% of the target light intensity to the portion of the region that received a 50% dose by the first exposure unit. Thus, the doses or exposures of two exposure units is effectively "mixed" for that portion of the region such that it receives a partial dose from one exposure unit and a partial dose from another exposure unit. Dose mixing can be achieved by performing a "localized multipass" at corresponding scan region boundaries. More specifically, multiple passes of a scan can be performed about the boundary to achieve a dose mixing effect.

FIGS. 3A-3D are top-down views 300A-300D of an inner-to-outer scan path of a scan region 320 of a substrate through a single digital lithography exposure unit ("exposure unit") 310 of a digital lithography system, in accordance with some embodiments. The exposure unit 310 can be, for example, the exposure unit 120-1 of the digital lithography system 100 described above with reference to FIG. 1. The substrate is disposed on a stage (not shown). In some embodiments, the first designated area (e.g., the first sub-region of scan region 320) to be scanned may be proximate a horizontal centerline (e.g., a centerline in the X direction) of the scan region 320.

FIG. 3A shows the formation of a scanned area 330-1 within the scan region 320 after the first scan is performed using the exposure unit 310. More specifically, the stage moves the substrate in the positive X direction underneath the exposure unit 310 to form the scanned area 330-1. An edge 322 of the scan region 320 can be aligned with an edge 312 of the exposure unit 310 prior to a first scan performed. The stage moves the substrate in the X-Y direction(s) in accordance with a digital lithography scanning procedure performing a number of scans across the scan region 320. The amount of time that the exposure unit 310 uses to scan scanned area 330-1 may be referred to as a scan duration.

FIG. 3B shows the formation of a scanned area 330-2 after a second scan is performed using the exposure unit 310. More specifically, after the first scan is performed using the exposure unit 310, the stage moves the substrate in the positive Y direction to align the exposure unit 310 with the next designated region, and then the stage moves the substrate in the negative X direction underneath the exposure unit 310 to form the scanned area 330-2.

Figure 3C:
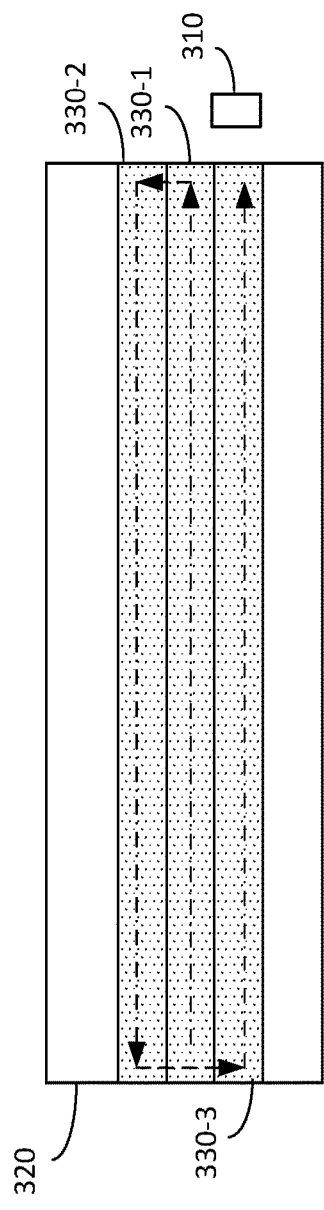

FIG. 3C shows the formation of a scanned area 330-3 after a third scan is performed using the exposure unit 310. More specifically, after the second scan is performed using the exposure unit 310, the stage moves the substrate in the negative Y direction to align the exposure unit 310 with the next designated region, and then the stage moves the substrate in the positive X direction underneath the exposure unit 310 to form the scanned area 330-3.

Figure 3D:
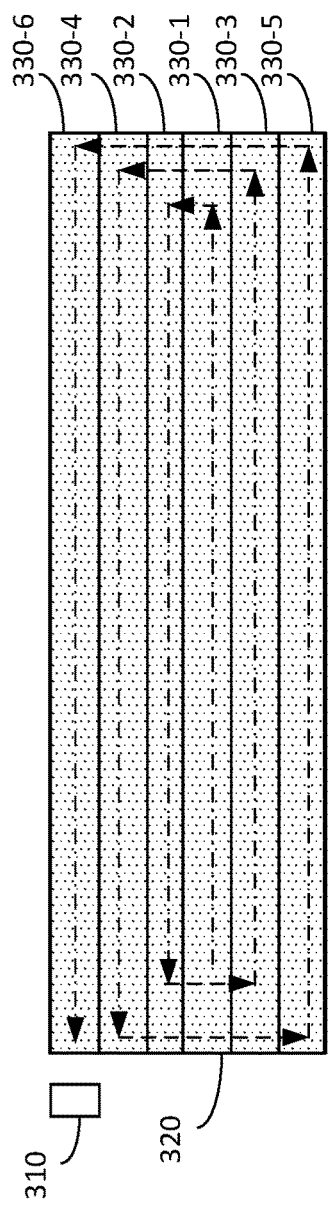

FIG. 3D shows the formation of additional scanned areas 330-4, 330-5, and 330-6 after a fourth, fifth, and sixth scans are performed using the exposure unit 310. More specifically, the stage moves the substrate back and forth in the Y direction to align the exposure unit 310 with the next designated region. The stage moves the substrate back and forth in the X direction to form the additional scanned areas. In some embodiments, scanned areas 330-5 and 330-6 correspond to stitching regions associated with the scan region 320 and an adjacent scan region.

FIGS. 4A-4C are diagrams 400A-400C showing examples of digital lithography exposure unit ("exposure unit") boundary smoothing, in accordance with some embodiments. The exposure unit boundary smoothing can be achieved by performing exposure unit boundary shifting and/or dose mixing. For example, the diagrams 400A-400C can each correspond to clipping layers that define the boundaries of the exposure units.

In FIG. 4A, the diagram 400A shows a first scan region 410-A corresponding to a first exposure unit and a second scan region 420-A corresponding a second exposure unit, separated by a boundary 415. The first and second exposure units can be adjacent exposure units attached to the same bridge. For example, the first exposure unit can correspond to exposure unit 1 of FIG. 1, and the second exposure unit can correspond to exposure unit 2 of FIG. 1. Alternatively, the first and second exposure units can be adjacent exposure units attached to different bridges. For example, the first exposure unit can correspond to exposure unit 1 of FIG. 1, and the second exposure unit can correspond to exposure unit 12 of FIG. 1.

In this example, there is no exposure unit boundary smoothing between the first and second scan regions 410-A and 420-A. More specifically, the first exposure unit is 100% responsible for scanning in the first scan region 410-A up to the boundary 415, and then the second exposure unit is 100% responsible for scanning in the second scan region 420-A up to the boundary 415. In other words, the first scan region 410-A has received 100% of the dose from the first exposure unit and the second scan region 420-A received 100% of the dose from the second exposure unit.

In FIG. 4B, the diagram 400B shows a first scan region 410-B corresponding to the first exposure unit and a second scan region 420-B corresponding to the second exposure unit. Here, exposure unit boundary smoothing between the first scan region 410-B and the second scan region 420-B has resulted in a sawtooth blending. More specifically, the first exposure unit is programmed to extend into the original scan region corresponding to the second exposure unit (e.g., scan region 410-B of FIG. 4A) and the second exposure unit is programmed to extend into the original scan region corresponding to the first exposure unit (e.g., scan region 410-A of FIG. 4A). The sawtooth blending is illustrated in FIG. 4B by vertical boundaries 430-1 through 430-4 and horizontal boundaries 435-1 through 435-3. The boundaries 430-1 through 430-4 and 435-1 through 435-1 may not be visible, and are provided to illustrate the exposure unit boundary smoothing shown in FIG. 3B. A mixed dose region is defined between the vertical boundary 430-1 and the vertical boundary 430-4. With respect to the region defined by the horizontal boundary 435-1, the first exposure unit provides a 75% dose and the second exposure unit provides a 25% dose. With respect to the region defined by the horizontal boundary 335-2, both the first exposure unit and the second exposure unit provide a 50% dose. With respect to the region defined by horizontal boundary 335-3, the first exposure unit provides a 25% dose and the second exposure unit provides a 75% dose.

The boundary smoothing shown in FIG. 4B can be obtained by performing exposure unit boundary shifting and/or dose mixing. Regarding exposure unit boundary shifting, multiple passes can be performed to obtain the sawtooth blending. In this illustrative example, four passes can be performed, where the exposure unit boundary is shifted after each pass (i.e., 4-pass boundary shifting). For example, in the one-bridge case, the exposure unit boundary can be shifted vertically (e.g., by shifting the clipping layer vertically) and in the two-bridge case, the exposure unit boundary can be shifted horizontally (e.g., by shifting the clipping layer horizontally). Regarding dose mixing, while performing a single pass, a "localized multi-pass" can be performed about the original boundary 415 so as to provide for designated amount of dosing for each of the exposure units. In this illustrative example, the first and second exposure units can each provide 4 dose amounts (100%, 75%, 50% and 25%) to achieve the exposure unit boundary smoothing shown in FIG. 4B.

In FIG. 4C, the diagram 400C shows a first exposure unit region 410-C and a second exposure unit region 420-C with gradual blending corresponding to a diagonal boundary 440. In some embodiments, the horizontal distance covered by boundary 440 corresponds to a stitching region between first exposure unit region 410-C and second exposure unit region 420-C. Gradual blending to achieve the diagonal boundary 440 is the theoretical ideal for boundary smoothing at stitching regions, in that it can be obtained after a suitable number (e.g., infinite number) of passes during exposure unit boundary shifting and/or a suitably fine (e.g., infinitesimally fine) mixing of doses about the boundary for each of the exposure units during dose mixing.

FIG. 5 is a diagram 500 of an example scan configuration 520 of digital lithography exposure units in a one-bridge implementation, in accordance with some embodiments. The scan configuration 520 illustrates an example stitching region 524 with respect to a first scan region 521 and a second scan region 522. In some embodiments, stitching region 524 is at an interface of the first scan region 521 and the second scan region 522. For example, the first scan region 521 may be associated with a first exposure unit while the second scan region 522 may be associated with a second exposure unit. The exposure unit boundaries of both the first and second exposure units may overlap and the overlapping region may correspond to the stitching region 524.

In some embodiments, the first exposure unit performs a scan of the stitching region 524 while the second exposure unit performs a scan of a sub-region of the second scan region 522. Subsequently, the second exposure unit performs a scan of the stitching region while the first exposure unit performs a scan of a sub-region of the first scan region. In some embodiments, the first exposure unit and the second exposure unit each perform a scan of the stitching region 524 using a partial dose so that over the two scans, the stitching region 524 receives a 100% dose. For example, the first exposure unit may scan the stitching region 524 with a 50% dose and the second exposure unit may subsequently scan the stitching region 524 with another 50%. In some embodiments, one or more of the boundary smoothing techniques described with respect to FIGS. 4A-4C is performed by the first and second exposure units with respect to the stitching region 524. In some embodiments, the second scan of the stitching region 524 is performed within a threshold amount of time subsequent to the first scan of the stitching region 524 as described below with respect to FIGS. 6A-6B.

Figure 6A:
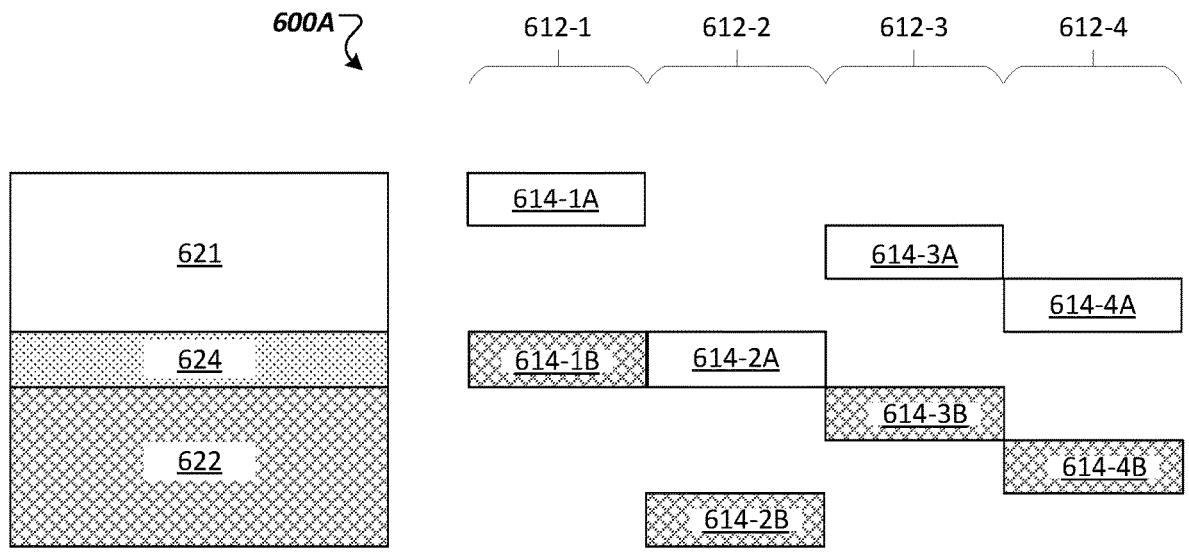
FIGS. 6A-6B are diagrams of example scan sequences of digital lithography exposure units with respect to time, in accordance with some embodiments.
Figure 6B:
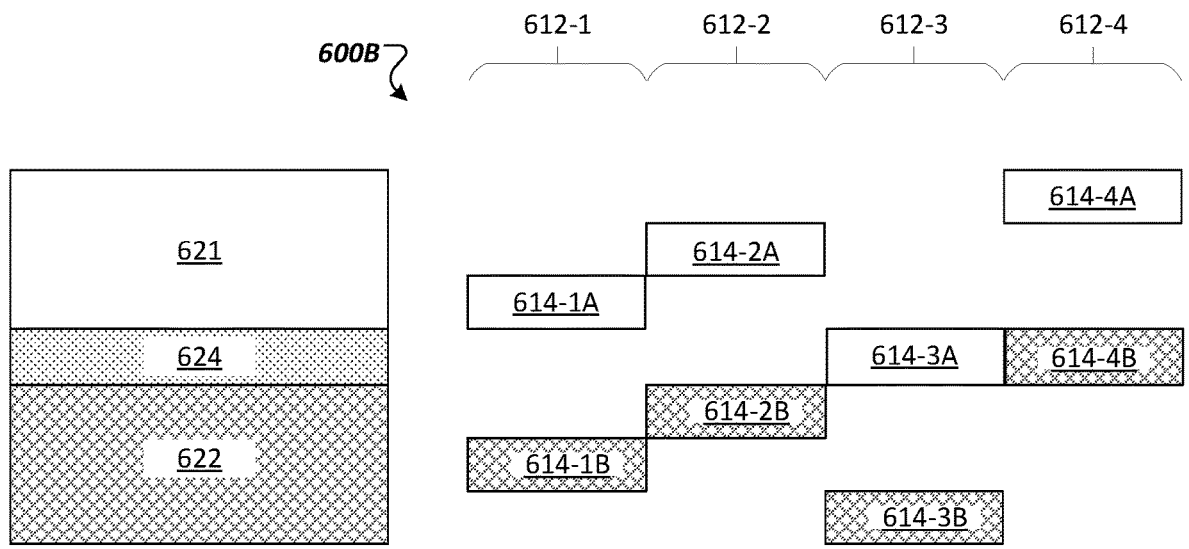

FIGS. 6A-6B are diagrams of example scan sequences of digital lithography exposure units with respect to time, in accordance with some embodiments. FIG. 6A is a diagram of an outer-to-inner scan sequence 600A of digital lithography exposure units with respect to time, in accordance with some embodiments. FIG. 6B is a diagram of an inner-to-outer scan sequence 600B of digital lithography exposure units with respect to time, in accordance with some embodiments.

In some embodiments, a stitching region 624 is associated with a first scan region 621 and a second scan region 622. The stitching region 624 may correspond to a boundary region between the first scan region 621 and the second scan region 622. In some embodiments, a first exposure unit of a digital lithography system may have a boundary area that includes the first scan region 621 and the stitching region 624. A second exposure unit may have a boundary area that includes the second scan region 622 and the stitching region 624. The first and second exposure units may be attached to the same bridge unit. Therefore, the first and second exposure units may move together relative to the substrate (i.e., the first scan region 621, the second scan region 622, and the stitching region 624).

Referring to FIG. 6A, an outer-to-inner scan sequence 600A is shown. For purposes of illustration and description, the outer-to-inner scan sequence 600A includes four distinct time intervals for performing scan operations. However, the sequence 600A is not limited to four distinct time intervals. In some embodiments, outer-to-inner scan sequence 600A includes more distinct time intervals for performing scan operations. In some embodiments, for the duration of time interval 612-1, a first exposure unit (not illustrated) scans a first sub-region 614-1A of first scan region 621. Concurrently, a second exposure unit (not illustrated) scans a first sub-region 614-1B of second scan region 622 corresponding to the stitching region 624. In some embodiments, the second exposure unit scans the first sub-region 614-1B corresponding to the stitching region 624 with a partial dose of radiation. The first exposure unit may scan the first sub-region 614-1A with a full dose of radiation. The sub-regions 614-1A and 614-1B may be "outer" sub-regions. In some embodiments, first sub-region 614-1A is adjacent to an outer edge of first scan region 621. By nature of the stitching region 624 lying at the boundary of the first scan region 621 and the second scan region 622, the sub-region 614-1B is adjacent to an outer edge of the second scan region 622. After the expiration of time interval 612-1, a stage upon which the substrate sits moves in the Y direction to align the first and second exposure units with the next sub-regions to be scanned.

For the duration of time interval 612-2, the first exposure unit scans a second sub-region 614-2A of the first scan region 621 while the second exposure unit scans a second sub-region 614-2B of the second scan region 622. In some embodiments, the first exposure unit scans the second sub-region 614-2A corresponding to the stitching region 624 with a partial dose of radiation. The second exposure may scan the second sub-region 614-2B with a full dose of radiation. In some embodiments, the second sub-regions 614-2A is located proximate to an outer edge of first scan region 621 and second sub-region 614-2B is located proximate to an outer edge of second scan region 622. In some embodiments, the second sub-regions 614-2A and 614-2B are located proximate an edge opposite to corresponding first sub-regions 614-1A and 614-1B. The sub-regions 614-2A and 614-2B may be "outer" sub-regions. After the expiration of time interval 612-2, the stage moves in the Y direction to align the first and second exposure units with the next sub-regions to be scanned.

For the duration of time interval 612-3, the first exposure unit scans a third sub-region 614-3A of the first scan region 621 while the second exposure unit scans a third sub-region 614-3B of the second scan region 622. The third sub-region 614-3A may be proximate first sub-region 614-1A and third sub-region 614-3B may be proximate first sub-region 614-1B. The third sub-region 614-3A may be nearer a horizontal centerline of first scan region 621 than the first sub-region 614-1A and the third sub-region 614-3B may be nearer a horizontal centerline of the second scan region 622 than the first sub-region 614-1B. In some embodiments, the third sub-regions 614-3A and 614-3B are "inner" sub-regions. After the expiration of time interval 612-3, the stage moves in the Y direction to align the first and second exposure units with the next sub-regions to be scanned.

For the duration of time interval 612-4, the first exposure unit scans a fourth sub-region 614-4A of the first scan region 621 while the second exposure unit scans a fourth sub-region 614-4B of the second scan region 622. The fourth sub-region 614-4A may be proximate second sub-region 6142-A and fourth sub-region 614-4B may be proximate second sub-region 614-2B. Fourth sub-region 614-4A may be nearer the horizontal centerline of the first scan region 621 than the second sub-region 614-2A and the fourth sub-region 614-4B may be nearer the horizontal centerline of the second scan region 622 than the second sub-region 614-2B. In some embodiments, the fourth sub-regions 614-4A and 614-4B are "inner" sub-regions. In some embodiments, according to scan sequence 600A, outer sub-regions are scanned prior to inner sub-regions. After the expiration of time interval 612-4, all of first scan region 621 and second scan region 622 may be scanned and may form one or more scan features produced by the scannings. Each of time intervals 612-1, 612-2, 612-3, and/or 612-4 may be a scan duration.

Referring to FIG. 6B, an inner-to-outer scan sequence is shown. For purposes of illustration and description, the inner-to-outer scan sequence 600B includes four distinct time intervals for performing scan operations. However, the sequence 600B is not limited to four time intervals. In some embodiments, inner-to-outer scan sequence 600B includes more distinct time intervals for performing scan operations. In some embodiments, for the duration of time interval 612-1, a first exposure unit scans a first sub-region 614-1A of first scan region 621 and a second exposure unit scans a first sub-region 614-1B of second scan region 622. First sub-regions 614-1A and 614-1B may be "inner" sub-regions of respective first scan region 621 and second scan region 622. In some embodiments, first sub-region 614-1A is proximate a horizontal centerline of first scan region 621 and first sub-region 614-1B is proximate a horizontal centerline of second scan region 622. After the expiration of time interval 612-1, the stage moves in the Y direction to align the first and second exposure units with the next sub-regions to be scanned.

In some embodiments, for the duration of time interval 612-2, the first exposure unit scans a second sub-region 614-2A of first scan region 621 while the second exposure unit scans a second sub-region 614-2B of second scan region 622. Second sub-regions 614-2A and 614-2B may be "inner" sub-regions of respective first scan region 621 and second scan region 622. In some embodiments, second sub-region 614-2A is proximate the horizontal centerline of first scan region 621, opposite the centerline from first sub-region 614-1A. In some embodiments, second sub-region 614-2B is proximate the horizontal centerline of second scan region 622, opposite the centerline from first sub-region 614-1B. After the expiration of time interval 612-2, the stage moves in the Y direction to align the first and second exposure units with the next sub-regions to be scanned.

In some embodiments, for the duration of time interval 612-3, the first exposure unit scans a third sub-region 614-3A of first scan region 621 while the second exposure unit scans a third sub-region 614-3B of second scan region 622. Third sub-regions 614-3A and 614-3B may be "outer" sub-regions of respective first scan region 621 and second scan region 622. In some embodiments, third sub-region 614-3A is adjacent to an outer edge of first scan region 621. Third sub-region 614-3A may correspond to stitching region 624. In some embodiments, third sub-region 614-3B is adjacent to an outer edge of second scan region 622. In some embodiments, the first exposure unit scans the third sub-region 614-3A corresponding to the stitching region 624 with a partial dose of radiation. The second exposure unit may scan the third sub-region 614-3B with a full dose of radiation. After the expiration of time interval 612-3, the stage moves in the Y direction to align the first and second exposure units with the next sub-regions to be scanned.

In some embodiments, for the duration of time interval 612-4, the first exposure unit scans a fourth sub-region 614-4A of first scan region 621 while the second exposure unit scans a fourth sub-region 614-4B of second scan region 622. Fourth sub-regions 614-4A and 614-4B may be "outer" sub-regions of respective first scan region 621 and second scan region 622. In some embodiments, according to scan sequence 600B, inner sub-regions are scanned prior to outer sub-regions. After the expiration of time interval 612-4, all of first scan region 621 and second scan region 622 may be scanned and may form one or more scan features produced by the scannings.

In some embodiments, each time interval 612-1, 612-2, 612-3, and 612-4 is a predetermined length of time. In some embodiments, each time interval is less than 40 seconds in duration. In some embodiments, each time interval has a duration between one and 20 seconds. In some embodiments, each time interval has a duration of approximately 3 seconds. In some embodiments, each time interval has a duration of approximately 8 seconds. In some embodiments, scan operations performed on the stitching region 624 (e.g., a first scan performed by the first exposure unit and a second scan performed by the second exposure unit) occur at times that vary by less than forty seconds. In some embodiments, scan operations performed on the stitching region 624 occur at times that vary by between one and 20 seconds. In some embodiments, scan operations performed on the stitching region 624 occur at times that vary by less than 8 seconds.

In some embodiments, scan operations performed on the stitching region 624 occur at times that vary by less than 3 seconds.

FIG. 7 is a diagram showing features formed on a substrate by digital lithography processes, in accordance with some embodiments. Diagram 700A shows scanned features formed on a substrate using scan sequencing having a large delay in time between first and second scans on the stitching region 724. Diagram 700B shows scanned features formed on a substrate using the digital lithography scan sequencing described herein having a delay in time between first and second scans on the stitching region 724 below a threshold amount of time. Where scan operations are performed on the stitching region 724 with a delay longer than a threshold amount of time as shown by diagram 700A, abnormalities 726 in the features formed by the scanning can occur. Such abnormalities 726 can include defects that necessitate scrapping the scanned substrate. Where scan operation are performed on the stitching region 724 with a delay shorter than a threshold amount of time as shown by diagram 700B, abnormalities may not occur due to the delay between scannings. In some embodiments, the threshold amount of time is approximately 40 seconds. In some embodiments, the threshold amount of time is approximately 20 seconds. In some embodiments, the threshold amount of time is approximately 8 seconds. In some embodiments, the threshold amount of time is approximately 3 seconds. The delay between scanning the stitching region a first time using a first exposure unit and a second time using a second exposure unit can be reduced by using an inner-to-outer scan sequence or an outer-to-inner scan sequence with respect to the first scan region 721 and the second scan region 722. By reducing the delay between scans performed on the stitching region 724, fewer defects are formed in the substrate, leading to increased process output.

FIG. 8 depicts a flow diagram of a method 800 for implementing digital lithography scan sequencing, in accordance with some embodiments. The method may be performed by processing logic that may include hardware (circuitry, dedicated logic, etc.), computer-readable instructions (run on a general purpose computer system or a dedicated machine), or a combination of both. In an illustrative example, method 800 may be performed by a processing device of a digital lithography system. It should be noted that blocks depicted in FIG. 8 could be performed simultaneously or in a different order than that depicted.

At block 810, the processing logic receives instructions to perform a digital photolithography process to pattern a substrate. At block 820, the processing logic initiates the digital lithography process to pattern the substrate in accordance with instructions. The substrate can be disposed on a stage, and the stage can move in X-Y directions underneath digital lithography exposure units ("exposure units") in accordance with the instructions. For example, the instructions can be executed to implement scan sequencing as described herein above. In some embodiments, the digital lithography process is a multiple pass process that includes a plurality of passes to scan two or more adjacent scanning regions.

At block 830, the processing logic performs, at a first time, a first pass of a first exposure unit over a stitching region. The stitching region may be at an interface of a first scan region corresponding to the first exposure unit and a second scan region corresponding to the second exposure unit. In some embodiments, the first exposure unit provides a partial dose of radiation to the stitching region. For example, the first exposure unit can provide 50% of a total dose of radiation to the stitching region during the first pass. While the first exposure unit performs the first pass over the stitching region, the second exposure unit may perform a pass over a sub-region of the second scan region associated with the second exposure unit.

At block 840, the processing logic performs, at a second time, a second pass of a second exposure unit over the stitching region. In some embodiments, the second time varies from the first time by less than approximately 40 seconds. In some embodiments, the second time varies from the first time by less than approximately 20 seconds, by less than approximately 8 seconds, or by less than approximately 3 seconds. In some embodiments, the second exposure unit provides a partial dose of radiation to the stitching region. For example, the second exposure unit can provide 50% of a total dose of radiation to the stitching region during the first pass. In some embodiments, the first exposure unit contributes a first percentage of radiation to the stitching region during the first pass and the second exposure unit contributes a second percentage of radiation to the stitching region during the second pass. The sum of the first percentage and the second percentage equals 100%. While the second exposure unit performs the second pass over the stitching region, the first exposure unit may perform a pass over a sub-region of the first scan region associated with the first exposure unit.

In some embodiments, the first pass and/or the second pass occur at the beginning or at the end of a multiple pass digital lithography process. In some embodiments, the processing logic utilizes an outer-to-inner scan sequence described herein with respect to FIG. 6A or an inner-to-outer scan sequence described herein with respect to FIG. 6B. In some embodiments, the second pass of the second exposure unit over the stitching region occurs subsequent to the first pass of the first exposure unit over the stitching region.

Figure 9:
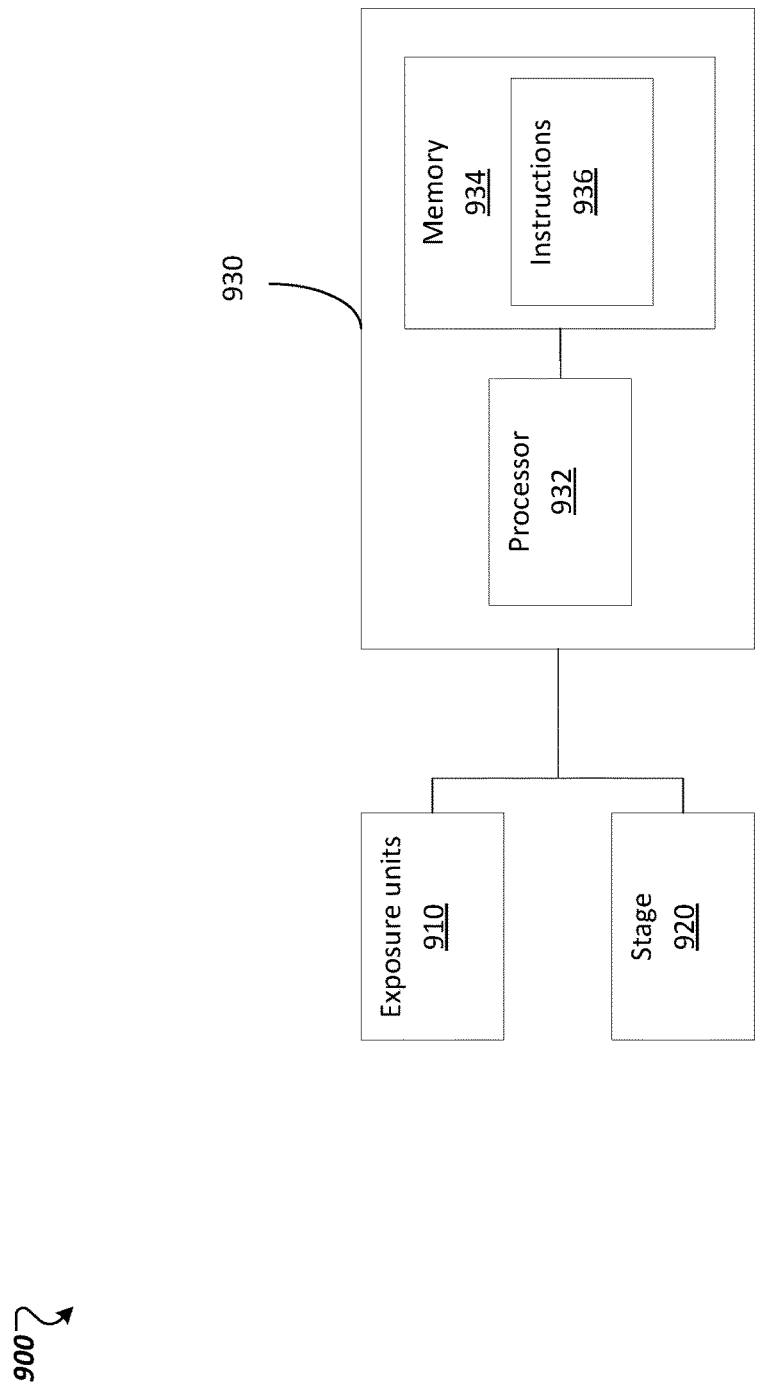
FIG. 9 is a block diagram of a digital lithography system, in accordance with some embodiments.

FIG. 9 is a block diagram illustrating a digital lithography system ("system") 900, in accordance with some embodiments. As shown, the system 900 includes digital lithography exposure units ("exposure units") 910, a stage 920, and a processing device 930. The processing device 930 includes a processor 932 operatively coupled to a memory 934. The memory can maintain instructions 936 for performing digital lithography within the system 900. For example, the instructions 926 can include instructions for controlling the movement of the stage 920 and/or exposure units 910. When executed, the instructions can implement the methods for performing exposure unit scan sequencing described herein above.

Figure 10:
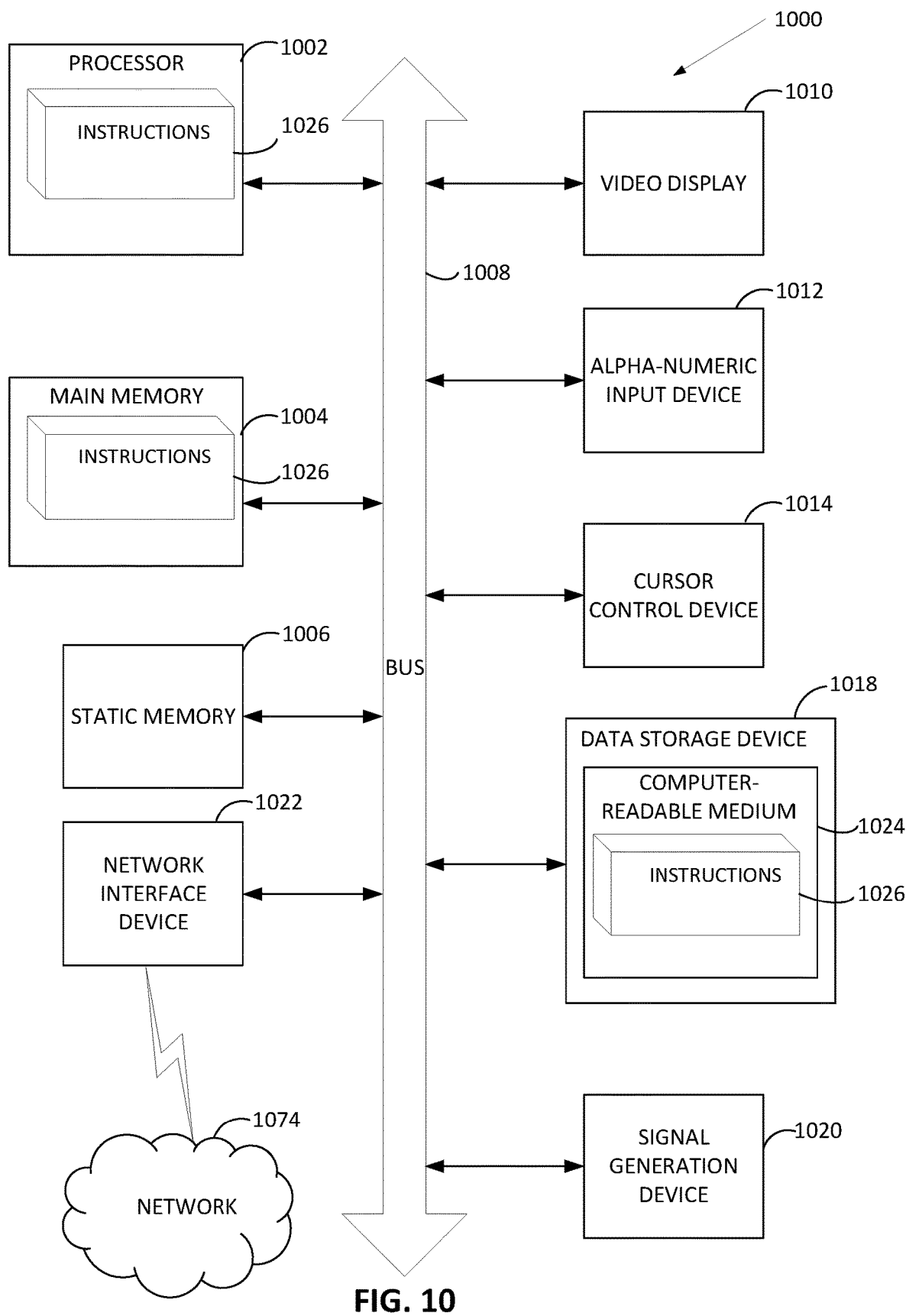
FIG. 10 is a block diagram illustrating a computer system, according to certain embodiments.

FIG. 10 is a block diagram illustrating a computer system 1000, according to certain embodiments. In some embodiments, computer system 1000 is connected (e.g., via a network, such as a Local Area Network (LAN), an intranet, an extranet, or the Internet) to other computer systems. In some embodiments, computer system 1000 operates in the capacity of a server or a client computer in a client-server environment, or as a peer computer in a peer-to-peer or distributed network environment. In some embodiments, computer system 1000 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 1000 includes a processing device 1002, a volatile memory 1004 (e.g., Random Access Memory (RAM)), a non-volatile memory 1006 (e.g., Read-Only Memory (ROM) or Electrically-Erasable Programmable ROM (EEPROM)), and a data storage device 1016, which communicate with each other via a bus 1008.

In some embodiments, processing device 1002 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 1000 further includes a network interface device 1022 (e.g., coupled to network 1074). In some embodiments, computer system 1000 also includes a video display unit 1010 (e.g., an LCD), an alphanumeric input device 1012 (e.g., a keyboard), a cursor control device 1014 (e.g., a mouse), and a signal generation device 1020.

In some implementations, data storage device 1016 includes a non-transitory computer-readable storage medium 1024 on which store instructions 1026 encoding any one or more of the methods or functions described herein. For example, the instructions 1026 can include instructions for controlling the movement of the stage and/or digital lithography exposure units ("exposure units") of a digital lithography system, which, when executed, can implement the methods for performing exposure unit scan sequencing described herein.

In some embodiments, instructions 1026 also reside, completely or partially, within volatile memory 1004 and/or within processing device 1002 during execution thereof by computer system 1000, hence, in some embodiments, volatile memory 1004 and processing device 1002 also constitute machine-readable storage media.

While computer-readable storage medium 1024 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "training," "identifying," "further training," "re-training," "causing," "receiving," "providing," "obtaining," "optimizing," "determining," "updating," "initializing," "generating," "adding," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. In some embodiments, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. Such a computer program is stored in a computer-readable tangible storage medium.

The methods and illustrative examples described herein are not inherently related to any particular computer or other apparatus. In some embodiments, various general purpose systems are used in accordance with the teachings described herein. In some embodiments, a more specialized apparatus is constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A digital lithography system comprising:
   a plurality of scan regions comprising a first scan region and a second scan region adjacent to the first scan region;
   a plurality of exposure units located above the plurality of scan regions, the plurality of exposure units comprising a first exposure unit associated with the first scan region and a second exposure unit associated with the second scan region;
   a memory; and
   at least one processing device operatively coupled to the memory, the at least one processing device to:
   initiate a digital lithography process to pattern a substrate disposed on a stage in accordance with instructions;
   perform a first pass of the first exposure unit over a stitching region at an interface of the first scan region and the second scan region at a first time; and
   perform a second pass of the second exposure unit over the stitching region at a second time that varies from the first time by less than forty seconds.

2. The digital lithography system of claim 1, wherein the digital lithography process is a multiple pass process comprising a plurality of passes, and wherein performing the digital lithography process comprises performing the second pass subsequent to the first pass at a beginning of the multiple pass process or at an end of the multiple pass process.

3. The digital lithography system of claim 1, wherein the first exposure unit and the second exposure unit are attached to a same bridge of the digital lithography system, and wherein to perform the digital lithography process, the at least one processing device is to:
   scan, using the second exposure unit, a first sub-region of the second scan region while performing the first pass using the first exposure unit; and
   scan, using the first exposure unit, a second sub-region of the first scan region while performing the second pass using the first exposure unit.

4. The digital lithography system of claim 1, wherein the digital lithography process comprises:
   scanning a first sub-region of a respective scan region of the plurality of scan regions proximate a first edge of the respective scan region;
   subsequently scanning a second sub-region of the respective scan region proximate a second edge of the respective scan region opposite the first edge, wherein the first sub-region or the second sub-region comprise the stitching region; and subsequently scanning a third sub-region of the respective scan region proximate the first sub-region opposite the first edge.

5. The digital lithography system of claim 1, wherein the digital lithography process comprises:
scanning a first sub-region of a respective scan region of the plurality of scan regions proximate a centerline of the respective scan region;
subsequently scanning a second sub-region of the respective scan region proximate the first sub-region toward a first edge of the respective scan region;
scanning a third sub-region of the respective scan region proximate the first edge or a second edge of the respective scan region; and
subsequently scanning a fourth sub-region of the respective scan region proximate the first edge or the second edge opposite the third sub-region, wherein the third sub-region or the fourth sub-region comprise the stitching region.

6. The digital lithography system of claim 1, wherein performing the first pass and performing the second pass comprises performing dose mixing with respect to the stitching region, wherein performing the dose mixing comprises having the first exposure unit contribute a first percentage of a total dose to the stitching region and the second exposure unit contribute a second percentage of the total dose to the stitching region, such that a sum of the first percentage and the second percentage equals 100%.

7. The digital lithography system of claim 1, wherein the second time varies from the first time approximately one scan duration.

8. A system comprising:
a memory; and
at least one processing device operatively coupled to the memory, the at least one processing device to:
initiate a digital lithography process to pattern a substrate in accordance with instructions;
perform a first pass of a first exposure unit over a stitching region at an interface of a first scan region of a plurality of scan regions and a second scan region of the plurality of scan regions at a first time; and
perform a second pass of a second exposure unit over the stitching region at a second time that varies from the first time by less than forty seconds.

9. The system of claim 8, wherein the digital lithography process is a multiple pass process comprising a plurality of passes, and wherein performing the digital lithography process comprises performing the second pass subsequent to the first pass at a beginning of the multiple pass process or at an end of the multiple pass process.

10. The system of claim 8, wherein the first exposure unit and the second exposure unit are attached to a same bridge of the system, and wherein to perform the digital lithography process, the at least one processing device is to:
scan, using the second exposure unit, a first sub-region of the second scan region while performing the first pass using the first exposure unit; and
scan, using the first exposure unit, a second sub-region of the first scan region while performing the second pass using the first exposure unit.

11. The system of claim 8, wherein the digital lithography process comprises:
scanning a first sub-region of a respective scan region of the plurality of scan regions proximate a first edge of the respective scan region;
subsequently scanning a second sub-region of the respective scan region proximate a second edge of the respective scan region opposite the first edge, wherein the first sub-region or the second sub-region comprise the stitching region; and
subsequently scanning a third sub-region of the respective scan region proximate the first sub-region opposite the first edge.

12. The system of claim 8, wherein the digital lithography process comprises:
scanning a first sub-region of a respective scan region of the plurality of scan regions proximate a centerline of the respective scan region;
subsequently scanning a second sub-region of the respective scan region proximate the first sub-region toward a first edge of the respective scan region;
scanning a third sub-region of the respective scan region proximate the first edge or a second edge of the respective scan region; and
subsequently scanning a fourth sub-region of the respective scan region proximate the first edge or the second edge opposite the third sub-region, wherein the third sub-region or the fourth sub-region comprise the stitching region.

13. The system of claim 8, wherein performing the first pass and performing the second pass comprises performing dose mixing with respect to the stitching region wherein performing the dose mixing comprises having the first exposure unit contribute a first percentage of a total dose to the stitching region and the second exposure unit contribute a second percentage of the total dose to the stitching region, such that a sum of the first percentage and the second percentage equals 100%.

14. The system of claim 8, wherein the second time varies from the first time less than eight seconds.

15. A method comprising:
initiating, by a processing device, a digital lithography process to pattern a substrate in accordance with instructions;
performing a first pass of a first exposure unit over a stitching region at an interface of a first scan region of a plurality of scan regions and a second scan region of the plurality of scan regions at a first time; and
performing a second pass of a second exposure unit over the stitching region at a second time that varies from the first time by less than forty seconds.

16. The method of claim 15, wherein the digital lithography process is a multiple pass process comprising a plurality of passes, and wherein performing the digital lithography process comprises performing the second pass subsequent to the first pass at a beginning of the multiple pass process or at an end of the multiple pass process.

17. The method of claim 15, wherein the first exposure unit and the second exposure unit are attached to a same bridge of a digital lithography system, and wherein the digital lithography process comprises:
scanning, by the second exposure unit, a first sub-region of the second scan region while performing the first pass by the first exposure unit; and
scanning, by the first exposure unit, a second sub-region of the first scan region while performing the second pass by the first exposure unit.

18. The method of claim 15, wherein the digital lithography process comprises:
scanning a first sub-region of a respective scan region of the plurality of scan regions proximate a first edge of the respective scan region;

subsequently scanning a second sub-region of the respective scan region proximate a second edge of the respective scan region opposite the first edge, wherein the first sub-region or the second sub-region comprise the stitching region; and subsequently scanning a third sub-region of the respective scan region proximate the first sub-region opposite the first edge.

19. The method of claim 15, wherein the digital lithography process comprises:

scanning a first sub-region of a respective scan region of the plurality of scan regions proximate a centerline of the respective scan region;

subsequently scanning a second sub-region of the respective scan region proximate the first sub-region toward a first edge of the respective scan region;

scanning a third sub-region of the respective scan region proximate the first edge or a second edge of the respective scan region; and subsequently scanning a fourth sub-region of the respective scan region proximate the first edge or the second edge opposite the third sub-region, wherein the third sub-region or the fourth sub-region comprise the stitching region.

20. The method of claim 15, wherein performing the first pass and performing the second pass comprises performing dose mixing with respect to the stitching region, wherein performing the dose mixing comprises having the first exposure unit contribute a first percentage of a total dose to the stitching region and the second exposure unit contribute a second percentage of the total dose to the stitching region, such that a sum of the first percentage and the second percentage equals 100%.

* * * * *